United States Patent
Jang

(10) Patent No.: US 8,697,265 B2
(45) Date of Patent: Apr. 15, 2014

(54) PROTECTION CIRCUIT MODULE FOR SECONDARY BATTERY AND BATTERY PACK HAVING THE SAME

(75) Inventor: Young-Cheol Jang, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 336 days.

(21) Appl. No.: 12/851,450

(22) Filed: Aug. 5, 2010

(65) Prior Publication Data

US 2011/0123836 A1    May 26, 2011

Related U.S. Application Data

(60) Provisional application No. 61/264,638, filed on Nov. 25, 2009.

(51) Int. Cl.
*H01M 2/22* (2006.01)
*H01M 2/34* (2006.01)

(52) U.S. Cl.
USPC ............ 429/7; 429/62; 429/161; 429/211

(58) Field of Classification Search
None
See application file for complete search history.

(56) References Cited

U.S. PATENT DOCUMENTS

| | | | |
|---|---|---|---|
| 7,811,686 B2 | 10/2010 | Seo et al. | |
| 8,192,855 B2 * | 6/2012 | Kim | 429/7 |
| 8,293,402 B2 * | 10/2012 | Lee | 429/178 |
| 2003/0211385 A1 | 11/2003 | Yamazaki et al. | |
| 2006/0044728 A1 | 3/2006 | Kim et al. | |
| 2006/0046139 A1 | 3/2006 | Suzuki et al. | |
| 2006/0093896 A1 | 5/2006 | Hong et al. | |
| 2007/0154796 A1 | 7/2007 | Uh | |
| 2007/0264535 A1 | 11/2007 | Lee et al. | |
| 2007/0279001 A1 | 12/2007 | Tononishi | |
| 2008/0008910 A1 | 1/2008 | Koh | |
| 2008/0096101 A1 | 4/2008 | Kwag et al. | |
| 2008/0118820 A1 | 5/2008 | Jang et al. | |
| 2008/0171235 A1 | 7/2008 | Seo et al. | |
| 2008/0226974 A1 | 9/2008 | Jang et al. | |
| 2009/0176155 A1 | 7/2009 | Choi | |

(Continued)

FOREIGN PATENT DOCUMENTS

| | | |
|---|---|---|
| CN | 101083316 A | 12/2007 |
| CN | 101478034 A | 7/2009 |

(Continued)

OTHER PUBLICATIONS

EPO Office action dated Nov. 11, 2011 issued to Patent Application No. 10166101.5, which claims priority to corresponding U.S. Appl. No. 61/264,638 and U.S. Appl. No. 12/851,450.

(Continued)

*Primary Examiner* — Jonathan Crepeau
(74) *Attorney, Agent, or Firm* — Christie, Parker & Hale, LLP

(57) ABSTRACT

There are provided a protection circuit module for a secondary battery and a battery pack having the same. In one embodiment, a protection circuit module includes a mounting substrate and at least one connecting member positioned at one side of the mounting substrate. The connecting member is provided with a first layer having a first surface, a second layer having a second surface opposite to the first surface, and at least one spacer that allows the first and second surfaces to be spaced apart from each other.

7 Claims, 10 Drawing Sheets

(56) References Cited

U.S. PATENT DOCUMENTS

| | | |
|---|---|---|
| 2009/0176156 A1 | 7/2009 | Lee |
| 2009/0263711 A1* | 10/2009 | Kim et al. ............... 429/164 |
| 2009/0305118 A1* | 12/2009 | Kim ........................... 429/93 |
| 2010/0159291 A1 | 6/2010 | Kim |
| 2011/0151730 A1 | 6/2011 | Kim |
| 2011/0159323 A1 | 6/2011 | Kim et al. |

FOREIGN PATENT DOCUMENTS

| | | |
|---|---|---|
| EP | 1 804 314 A2 | 7/2007 |
| EP | 2 077 595 A2 | 7/2009 |
| JP | 05-114392 | 5/1993 |
| JP | 2001-057191 | 2/2001 |
| JP | 2002-164029 | 6/2002 |
| JP | 2002-251986 | 9/2002 |
| JP | 2002-289160 | 10/2002 |
| JP | 2004-247261 | 9/2004 |
| JP | 2005-268029 | 9/2005 |
| JP | 2007-26813 | 2/2007 |
| JP | 2007-184241 | 7/2007 |
| JP | 2009-123646 | 6/2009 |
| KR | 10-2005-0054800 | 6/2005 |
| KR | 10-2005-0087632 | 8/2005 |
| KR | 10-2006-0012810 | 2/2006 |
| KR | 10-2006-0050550 | 5/2006 |
| KR | 10-2007-0067781 | 6/2006 |
| KR | 10-0635743 B1 | 10/2006 |
| KR | 10-2007-0080868 A | 8/2007 |
| KR | 10-0760784 B1 | 9/2007 |
| KR | 10-2007-0101569 | 10/2007 |
| KR | 10-2008-0047982 | 5/2008 |
| KR | 10-2009-0064089 A | 6/2009 |
| KR | 10-2009-0075482 | 7/2009 |
| WO | WO 2007/061262 A1 | 5/2007 |
| WO | WO 2008/047986 A1 | 4/2008 |
| WO | WO 2009/078585 A1 | 6/2009 |

OTHER PUBLICATIONS

Extended European Search Report dated Mar. 15, 2011, issued in EP Application No. 10166101.5, 9 pages.

Patent Abstracts of Japan, and English machine translation of Japanese Publication 2001-057191, (33 pages).

Patent Abstracts of Japan, and English machine translation of Japanese Publication 2002-164029, (28 pages).

Patent Abstracts of Japan, and English machine translation of Japanese Publication 2004-247261, (61 pages).

Patent Abstracts of Japan, and English machine translation of Japanese Publication 2005-268029, (28 pages).

Patent Abstracts of Japan, and English machine translation of Japanese Publication 2007-184241, (33 pages).

Patent Abstracts of Japan, and English machine translation of Japanese Publication 2009-123646, (69 pages).

English machine translation of Korean Patent 10-0635743, (14 pages).

U.S. Office action dated Oct. 7, 2011, for cross reference U.S. Patent application, (11 pages).

U.S. Office action dated Jan. 18, 2012, for cross reference U.S. Patent application, (15 pages).

SIPO Office action dated Mar. 30, 2011 for Chinese Patent application 200910001304.9 with English translation, (8 pages).

SIPO Certificate of Patent dated Jan. 25, 2012 for Chinese Patent application 200910001304.9, with English translation of cover page only, (16 pages).

SIPO Office action dated Jan. 5, 2013 for corresponding Chinese Patent application 201010524090.6, with English translation, (19 pages).

* cited by examiner

PROTECTION CIRCUIT MODULE FOR SECONDARY BATTERY AND BATTERY PACK HAVING THE SAME

CROSS-REFERENCE TO RELATED APPLICATIONS

This application claims the benefit of U.S. Provisional Application No. 61/264,638, filed on Nov. 25, 2009, in the United States Patent and Trademark Office, the entire disclosure of which is incorporated herein by reference.

BACKGROUND

1. Field

An aspect of the present invention relates to a protection circuit module for a secondary battery.

2. Description of the Related Art

A secondary battery is a battery which can be repeatedly charged and discharged. Secondary batteries are classified into nickel-cadmium (Ni—Cd) secondary batteries, nickel-hydrogen (Ni-MH) secondary batteries, lithium secondary batteries, and the like. Lithium secondary batteries are divided into lithium ion secondary batteries using a liquid electrolyte and a lithium polymer secondary batteries using a polymer electrolyte, depending on the kind of electrolyte used. In addition, lithium secondary batteries are divided into a prismatic type, a cylinder type, a pouch type, and the like, depending on their shapes.

A battery pack using a lithium secondary battery typically includes a bare cell and a protection circuit module. The bare cell refers to a structure including an electrode assembly, an electrolyte and an outer case in which the electrode assembly and the electrolyte are housed. The protection circuit module protects the bare cell from overcharge or overdischarge when the bare cell is charged or discharged.

SUMMARY

According to aspects of the present invention, a protection circuit module is provided for a secondary battery, the protective circuit module having a connecting member for facilitating the connection of the protection circuit module to a bare cell, thereby allowing a battery pack incorporating the aforementioned protection circuit module to have improved productivity and yield.

According to an embodiment of the present invention, a protection circuit module for a secondary battery includes a substrate; and a connecting member on the substrate, the connecting member including a first layer; a second layer; and a spacer between the first layer and the second layer and spacing the first layer from the second layer.

In one embodiment, the connecting member is coupled to the substrate and is configured to be electrically connected to a tab of the secondary battery, wherein the tab may be an electrode tab of the secondary battery or a PTC tab electrically connected to an electrode terminal of the battery pack.

In one embodiment, the spacer is coupled to at least one of the first and second layers, and the spacer may be threaded into a groove in the second layer or it may be integral with the first layer. Further, the protection circuit module may include at least one additional spacer between the first and second layers and the spacer and one of the at least one additional spacers face each other and are oriented to contact each other.

In one embodiment, an area of the first layer is less than an area of the second layer and wherein the spacer extends from an edge of the first layer toward the second layer. The connecting member may further include a connection portion coupling together the first and second layers, and such the connecting portion may be integral with the first and second layers.

In another embodiment of the present invention, a battery pack is provided having a bare cell including an electrode assembly; a tab electrically connected to the bare cell; and a protection circuit module electrically coupled to the bare cell, the protection circuit module including a substrate; and a connecting member on the substrate electrically coupled to the tab, the connecting member having a first layer; a second layer; and a spacer between the first layer and the second layer and spacing the first layer from the second layer, wherein the tab is between the first and second layers.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
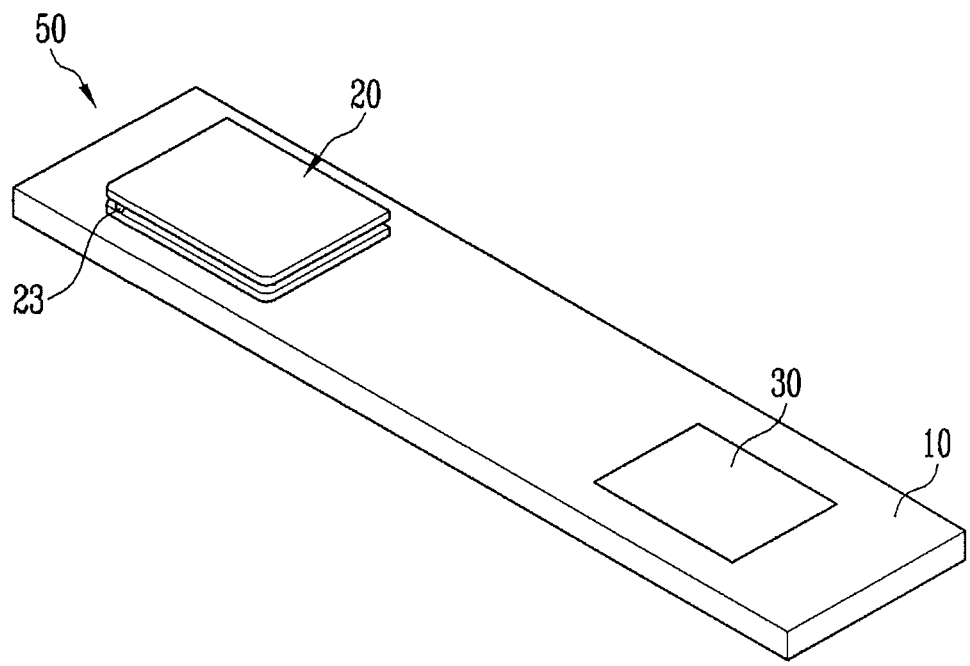
FIG. 1 is a schematic perspective view of a protection circuit module for a secondary battery according to an embodiment of the present invention.

Hereinafter, exemplary embodiments of the present invention will be described in detail with reference to the accompanying drawings so that they can be readily implemented by those skilled in the art.

Where the function and constitution are well-known in the relevant arts, further discussion will not be presented in the detailed description of the present invention for clarity. In the drawings, like numbers refer to like elements throughout. Also, the thicknesses or sizes of layers or regions are exaggerated for the convenience of description and clarity. For convenience of illustration, elements are appropriately projected in the drawings.

Figure 2:
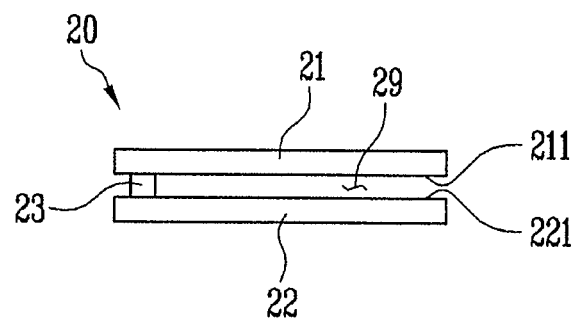
FIG. 2 is a front view of a connecting member of FIG. 1.

FIG. 1 is a schematic perspective view of a protection circuit module for a secondary battery according to an embodiment of the present invention. FIG. 2 is a front view of a connecting member of FIG. 1.

Referring to FIG. 1, the protection circuit module 50 includes a mounting substrate 10 and a connecting member 20 positioned at a side or surface of the mounting substrate 10. The protection circuit module 50 may be provided with a conductive layer 30 for electrical connection to an electronic component separate from the mounting substrate 10. Another connecting member 20 may be connected to the conductive layer 30.

The mounting substrate 10 is provided with a predetermined conductive pattern (not shown), which may include the conductive layer 30. One or more electronic components for controlling voltage or current in charge/discharge of the secondary battery may be mounted on the mounting substrate 10.

As illustrated in FIG. 2, the connecting member 20 includes a first layer 21 provided with a first surface 211, a second layer 22 provided with a second surface 221, and a spacer 23 that spaces the first and second surfaces 211 and 221 from each other.

Each of the first and second layers 21 and 22 may be a substantially flat plate. In this embodiment, the spacer 23 serves to allow the first and second layers 21 and 22 to be bonded to each other. That is, the spacer 23 is provided to support the first layer 21 on the second layer 22 connected to the mounting substrate 10 while allowing the first and second layers 21 and 22 to be spaced from each other.

Nickel or nickel alloy may be used as the material of each of the first and second layers 21 and 22, and of the spacer 23, considering their durability and conductivity.

The connecting member 20 is bonded to one surface of the mounting substrate 10. For example, the connecting member 20 may be bonded to the surface of the mounting substrate 10 by a reflow soldering process. In the reflow soldering process, welding is performed by coating solder cream on a corresponding portion of the mounting substrate 10 (a portion of the conductive layer 30 on which the conductive pattern is formed) and then melting the solder cream by the application of heat. The connecting member 20 bonded to one surface of the mounting substrate 10 may be electrically connected to an external terminal (see 155 of FIG. 11) positioned on another surface of the mounting substrate 10 through the conductive pattern in the mounting substrate 10.

The connecting member 20 is electrically connected to a tab of the bare cell. An electrode tab will be used as an example herein, but it will be appreciated that the tab may also be a PTC tab or any other tab or portion of material desired to be electrically connected to the protection circuit module. In one embodiment, the connecting member 20 is provided so that the tab of the bare cell is inserted or fitted between the first and second layers 21 and 22 through an opening 29.

In one embodiment, the connecting member 20 of this embodiment serves to connect an electrode tab of the bare cell to the external terminal. The connecting member 20 is provided with a non-bent structure designed so that the bonding process with the electrode tab is easily performed. In this embodiment, the non-bent structure refers to a structure in which the connecting member 20 is not bent when the electrode tab is bonded to the connecting member 20. For example, the non-bent structure is a structure in which, when an electrode tab is bonded to a connecting member through a process such as welding, portions of the connecting member do not have to be bent to surround the electrode tab in a sandwich form in order to weld the electrode tab to the connecting member.

According to this embodiment, since the movement of the electrode tab is limited by inserting the electrode tab between the first and second layers, the electrode tab is not easily detachable from its welded position. Thus, the bonding process, which requires a precise operation due to the structure of a small electrode tab and a small connecting member, can be very rapidly and precisely performed. Further, a bonding strength is increased through the sandwich structure of the electrode tab and connecting member, thereby improving the durability and reliability of a protection circuit module and a battery pack using the protection circuit module.

Hereinafter, various embodiments for the connecting member of this embodiment will be described in more detailed below.

Figure 3A:
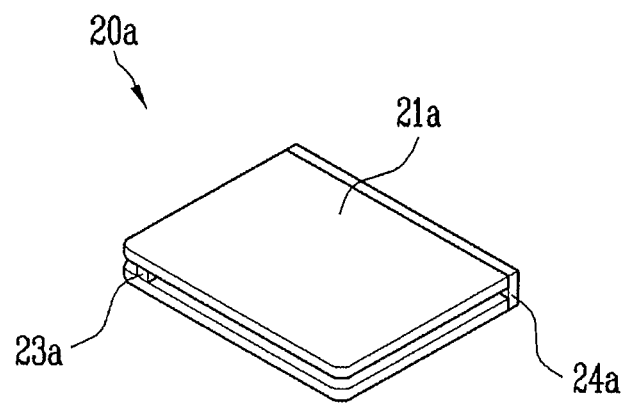
FIG. 3A is a perspective view of a connecting member of a protection circuit module according to another embodiment of the present invention.

FIG. 3A is a perspective view of a connecting member of a protection circuit module according to another embodiment of the present invention.

Referring to FIG. 3A, the connecting member 20a includes a first layer 21a, a second layer 22a, a spacer 23a and a connecting portion 24a. In this embodiment, the first and second layers 21a and 22a have a double-layered structure in which they are opposite to each other and spaced by a predetermined interval. The first and second layers 21a and 22a are supported by and electrically connected to each other by the spacer 23a and the connecting portion 24a.

The spacer 23a may be formed as a projection protruding from the first or second layer 21a or 22a. The spacer 23a may have the shape of a cylinder, a hemisphere, a prism or the like. The spacer 23a may be bonded to any one of or both of the first and second layers 21a and 22a.

The connecting portion 24a is provided to allow one side of each of the first and second layers 21a and 22a to be bonded to each other. The connecting portion 24a may be provided to allow the entire or only a portion of the sides of the first and second layers 21a and 22a, corresponding to and facing each other, to be bonded together. The connecting portion 24a may be formed of the same material as that of the spacer 23a.

In the connecting member 20a of this embodiment, while the interval between the first and second layers 21a and 22a is maintained by the spacer 23a, the first and second layers 21a and 22a can be strongly bonded to each other through the connecting portion 24a, and the conductivity between the first and second layers 21a and 22a can be reinforced.

Figure 3B:
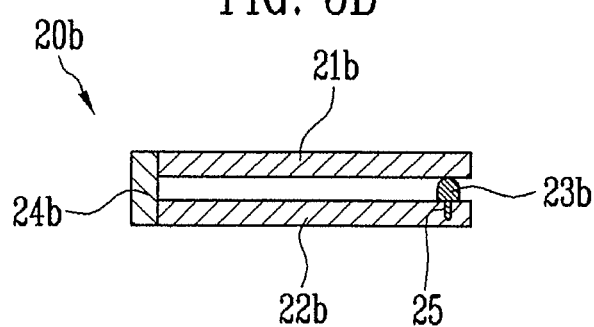
FIG. 3B is a sectional view of a connecting member of a protection circuit module according to still another embodiment of the present invention.

FIG. 3B is a sectional view of a connecting member of a protection circuit module according to still another embodiment of the present invention. FIG. 3B may correspond to a predetermined section of FIG. 3A except the connecting structure of the spacer and the second layer.

Referring to FIG. 3B, the connecting member 20b includes a first layer 21b, a second layer 22b, a spacer 23b and a connecting portion 24b. The first layer 21b, the second layer 22b and the connecting portion 24b are substantially identical to the first layer 21a, the second layer 22a and the connecting portion 24a, described with reference to FIG. 3A.

The spacer 23b may have the shape of a bolt or screw. The spacer 23b may be screw-coupled to a nut portion or groove 25 of the second layer 22b. According to this embodiment, after a spacer is prepared as a separate component, it may be located between the first and second layers 21a and 22a. It will be apparent that such a structure of the spacer may be applied to the spacer 23 described with reference to FIG. 2.

Figure 4:
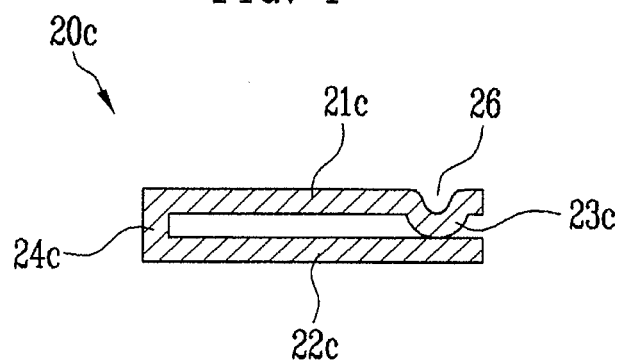
FIG. 4 is a sectional view of a connecting member of a protection circuit module according to still another embodiment of the present invention.

FIG. 4 is a sectional view of a connecting member of a protection circuit module according to still another embodiment of the present invention.

Referring to FIG. 4, the connecting member 20c includes a first layer 21c, a second layer 22c, a spacer 23c and a connecting portion 24c. As shown in the figure, the connecting member 20c may be a single integral component.

In this embodiment, the first and second layers 21c and 22c have a structure formed by bending a single member generally in the shape of "⊏" according to the Korean alphabet or generally a square "C" shape. The connecting portion 24c corresponds to a corresponding portion of the single member doubly bent to form the first and second layers 21c and 22c, i.e., a portion between the bent portions of the single member. The spacer 23c is a protruding portion protruding in an embossed shape from the first layer 21c.

The spacer 23c protrudes toward the second layer 22c from the first layer 21c, and an end portion of the spacer 23c is configured to contact the second layer 22c, but is not necessarily in continuous contact with the second layer 22c, or may not contact the second layer at all. A concave portion 26 corresponding to the protruding portion is provided to the other surface of the first layer 21c, i.e., a surface opposite to the surface from which the spacer 23c protrudes.

In the structure of the spacer, the aforementioned protruding portion may be different from the aforementioned projection because it is provided with a corresponding concave portion.

According to this embodiment, the spacer 23c having the protruding portion is formed at a portion of the first layer 21c of the single member, and the single member is bent in the shape of a "⊏", so that the connecting member 20c can be very easily manufactured. It will be apparent that the structure of the protruding portion in the spacer 23c may be applied to the spacer described with reference to FIG. 2 or 3A.

Figure 5:
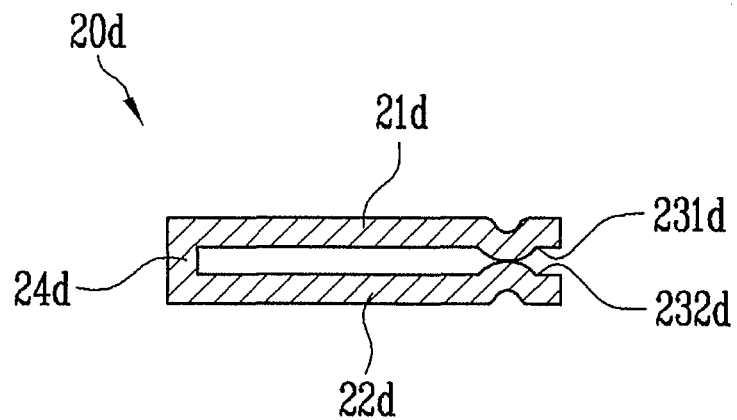
FIG. 5 is a sectional view of a connecting member of a protection circuit module according to still another embodiment of the present invention.

FIG. 5 is a sectional view of a connecting member of a protection circuit module according to still another embodiment of the present invention.

Referring to FIG. 5, the connecting member 20d includes a first layer 21d, a second layer 22d, a first spacer 231d, a second spacer 232d and a connecting portion 24d. Similarly to the connecting member 20c, the connecting member 20d may be a single integral component.

The first spacer 231d is provided to protrude toward the second layer 22d from the first layer 21d. The second spacer 232d is provided to protrude toward the first layer 21d from the second layer 22d. In one embodiment, the first and second spacers 231d and 232d are provided opposite to each other.

In this embodiment, the connecting member 20d is substantially identical to the connecting member 20c described with reference to FIG. 4, except that the first and second spacers 231d and 232d correspond to one spacer 23c.

It will be apparent that the structures of the first and second spacers 231d and 232d of this embodiment may be applied to the spacer described with reference to FIG. 2 or 3A.

Figure 6:
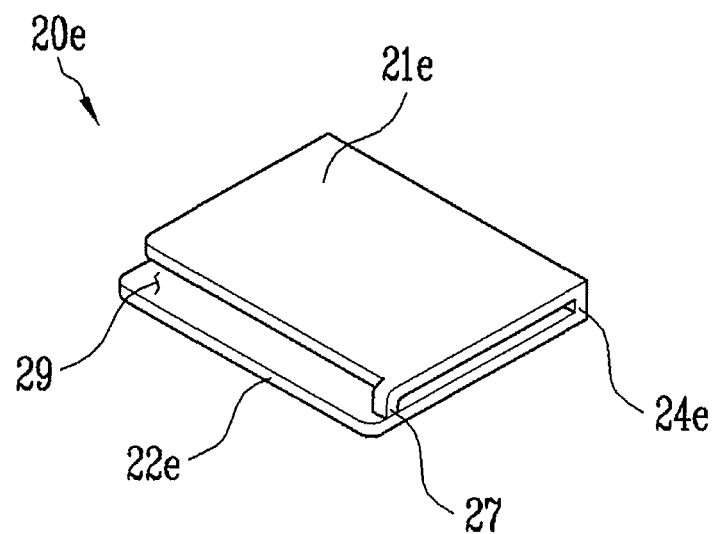
FIG. 6 is a perspective view of a connecting member of a protection circuit module according to still another embodiment of the present invention.

FIG. 6 is a perspective view of a connecting member of a protection circuit module according to still another embodiment of the present invention.

Referring to FIG. 6, the connecting member 20e includes a first layer 21e, a second layer 22e, a spacer 27 and a connecting portion 24e.

In this embodiment, the area of the first layer 21e is smaller than that of the second layer 22e. The first layer 21e, the second layer 22e and the connecting portion 24e may be integrally formed as a single member.

The spacer 27 is provided as an extending portion bent approximately vertically or perpendicularly toward the second layer 22e from one side surface of the first layer 21e. An end portion of the spacer 27 is configured to contact one surface of the second layer 22e. The spacer 27 may be integrally formed with the first layer 21e. In another embodiment, if the spacer 27 is a separate member, it may be bonded to the first layer 21e so as to protrude from the side surface of the first layer 21e.

According to this embodiment, the area of the first layer 21e is formed smaller than that of the second layer 22e, so that the electrode tab can be effectively inserted between the first and second layers 21e and 22e. For example, the electrode tab may be inserted into the connecting member 20e through an opening formed between the first and second layers 21e and 22e by sliding the tab against one surface of the second layer 22e. According to this embodiment, movement of the electrode tab between the first and second layers 21e and 22e in an undesired direction may be limited.

Figure 7A:
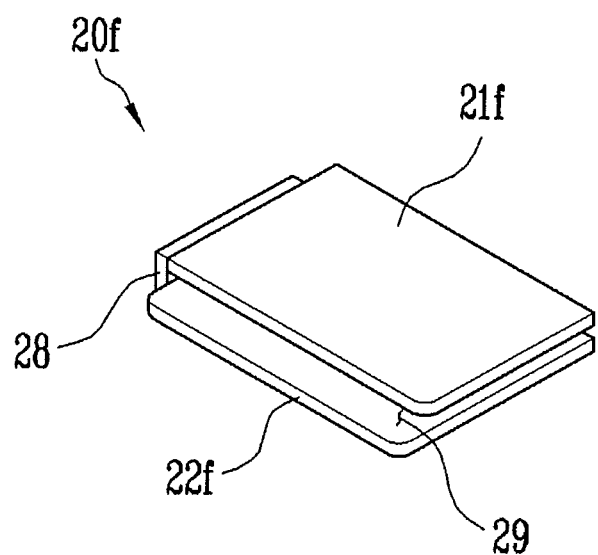
FIGS. 7A and 7B are perspective views of connecting members of a protection circuit module according to still another embodiment of the present invention.
Figure 7B:
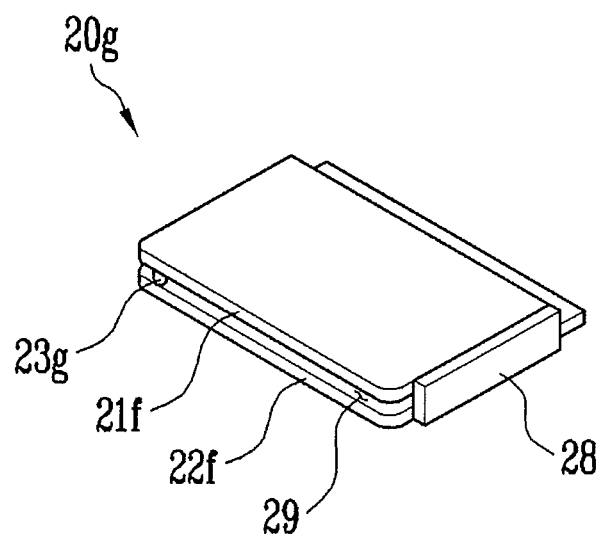

FIGS. 7A and 7B are perspective views of connecting members of a protection circuit module according to still another embodiment of the present invention.

Referring to FIG. 7A, a connecting member 20f includes a first layer 21f, a second layer 22f and a spacer 28.

In this embodiment, the area of the first layer 21f is smaller than that of the second layer 22f. The first and second layers 21e and 22e may be formed as separate members.

The spacer 28 may be formed as a side connecting portion that connects side surfaces of the first and second layers 21f and 22f corresponding to each other. The side connecting portion is different from the connecting portions 24a, 24b, 24c, 24d and 24e of the aforementioned embodiments in that it is formed at one side surface positioned in the width or length direction of the connecting member 20f. The spacer 28 may be formed along the entire of a pair of side surfaces of the first and second layers 21f and 22f corresponding to each other or a portion of the side surface of the first and second layers 21f and 22f.

As a modification of this embodiment, a connecting member 20g may further include any one 23g of the spacers according to the aforementioned embodiments. For example, the spacer 23g may be formed in the shape of a protruding portion or projection.

Figure 8:
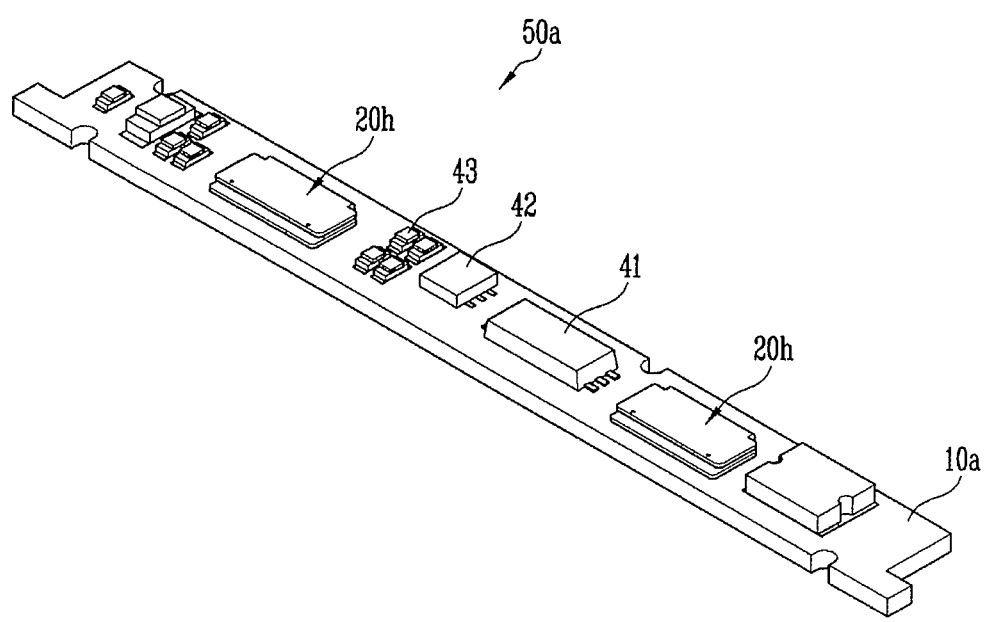
FIG. 8 is a perspective view of a protection circuit module for a secondary battery according to still another embodiment of the present invention.
Figure 9:
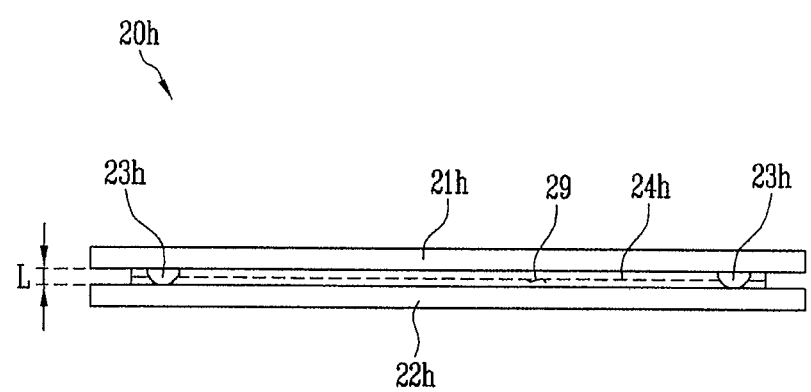
FIG. 9 is a front view of a connecting member of FIG. 8.

FIG. 8 is a perspective view of a protection circuit module for a secondary battery according to still another embodiment of the present invention. FIG. 9 is a front view of a connecting member of FIG. 8.

Referring to FIGS. 8 and 9, the protection circuit module 50a includes a mounting substrate 10a, connecting members 20h each positioned at one side of the mounting substrate 10a, and electronic components 41, 42 and 43 positioned at one side of the mounting substrate 10a. Each of the electronic components 41, 42 and 43 may include a switching element, a control circuit, a resistor, a capacitor and the like.

The mounting substrate 10a may be identical to the mounting substrate 10 described with reference to FIG. 1, except the form of a conductive pattern. For example, the mounting substrate 10a may be implemented as a printed circuit board on which a conductive line pattern is formed.

The connecting member 20h includes a first layer 21h, a second layer 22h, two spacers 23h and a connecting portion 24h. The first layer 21h, the second layer 22h and the connecting portion 24h of the connecting member 20h may be formed by bending a single member in the shape of a "⊏".

In this embodiment, the area of the first layer 21h of the connecting member 20h is smaller than that of the second layer 22h. For example, the second layer 22h may be formed in the shape of a flat plate of which the width and length are about 1.5 mm and about 1.0 mm, respectively. The first layer 21h may be formed in the shape of a flat plate of which the width and length are about 1.5 mm and about 0.90 mm, respectively.

Each of the two spacers 23h is provided as a hemisphere-shaped projection protruding toward one surface of the second layer 22h from the first layer 21h. The two spacers 23h are respectively located adjacent to two edges in the width direction of the connecting member 20h (or the length direction of the mounting substrate 10a). In this embodiment, the two spacers 23h is integrally formed with the first layer 21h.

The distance between the first and second layers 21h and 22h or the height L of the opening 29 may be between about 0.05 and about 0.4 mm. The height L of the opening 29 substantially corresponds to the thickness of the electrode tab. The height L of the opening 29 is set slightly larger than the thickness of the electrode tab so that the electrode tab can be inserted between the first and second layers 21h and 22h through the opening 29.

The electrical connection between the connecting members 20h and the electrode tabs (see 134 and 135 of FIGS. 11 and 13) may be performed through a welding process such as resistance welding, considering external impact and the like.

In one embodiment, the welding strength between the connecting member 20h and the electrode tab is between about 2.75 kgf and about 2.85 kgf. Considering that the welding strength between a single-layered connecting member and an electrode tab is between about 2.25 kgf and about 2.35 kgf in a comparative example, it can be seen that the welding strength of this embodiment is enhanced as compared with that of the comparative example.

As described above, the connecting member 20h of the protection circuit module 50a according to this embodiment is provided to surround the electrode tab together with a non-bent structure, so that the welding process between the connecting member and the electrode tab can be considerably simplified, and the welding strength between the connecting member and the electrode tab can be enhanced.

Figure 10:
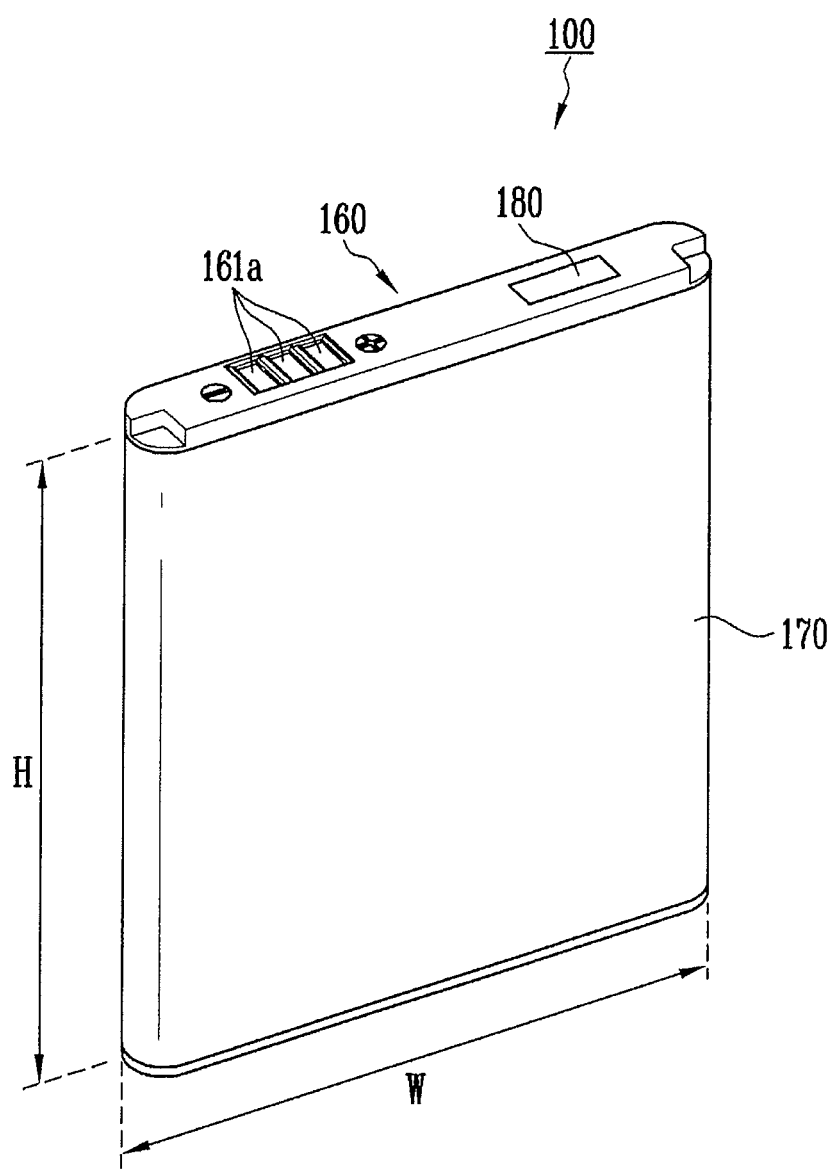
FIG. 10 is a perspective view of a battery pack according to an embodiment of the present invention.
Figure 11:
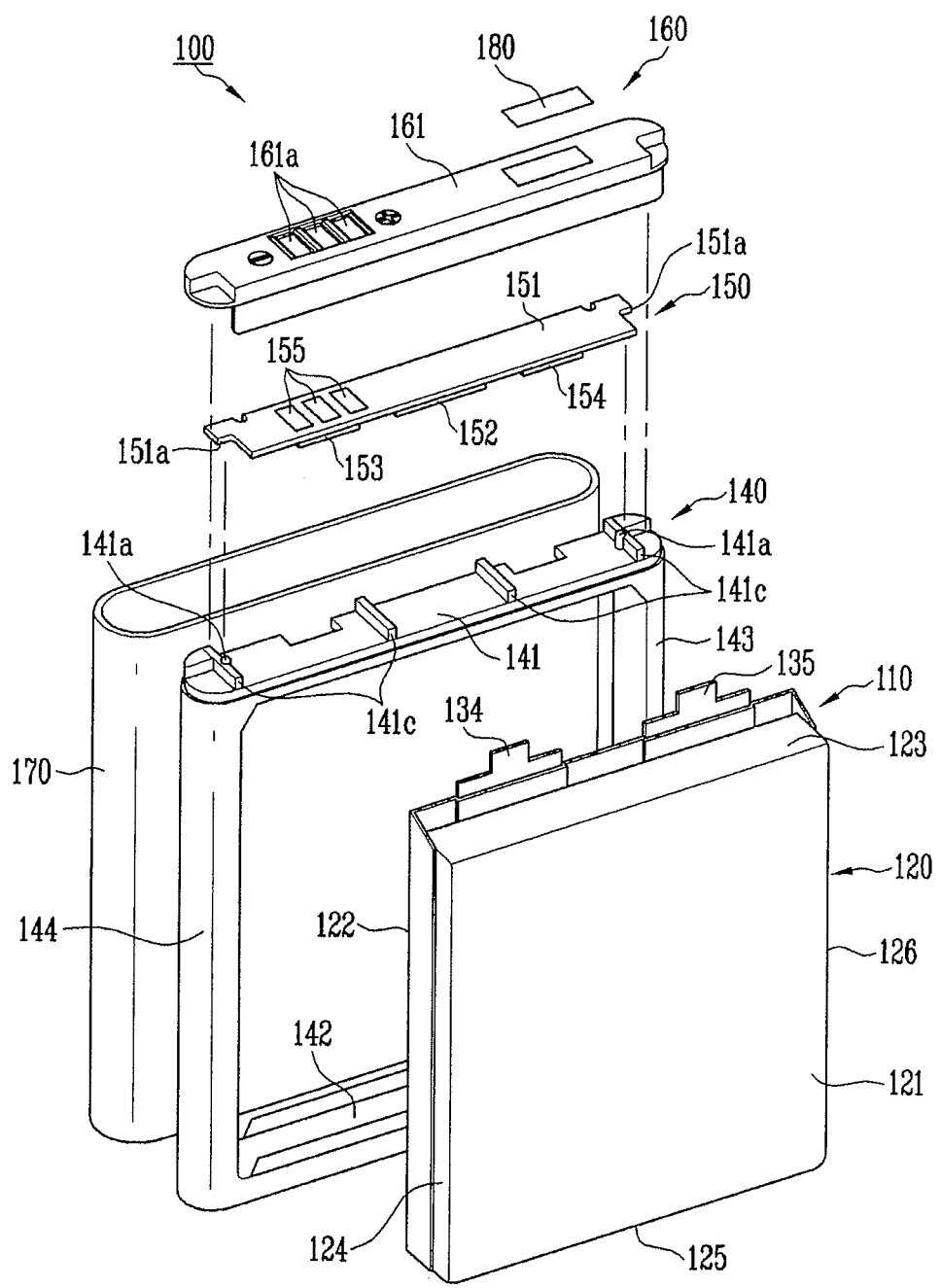
FIG. 11 is an exploded view of the battery pack of FIG. 10.
Figure 12:
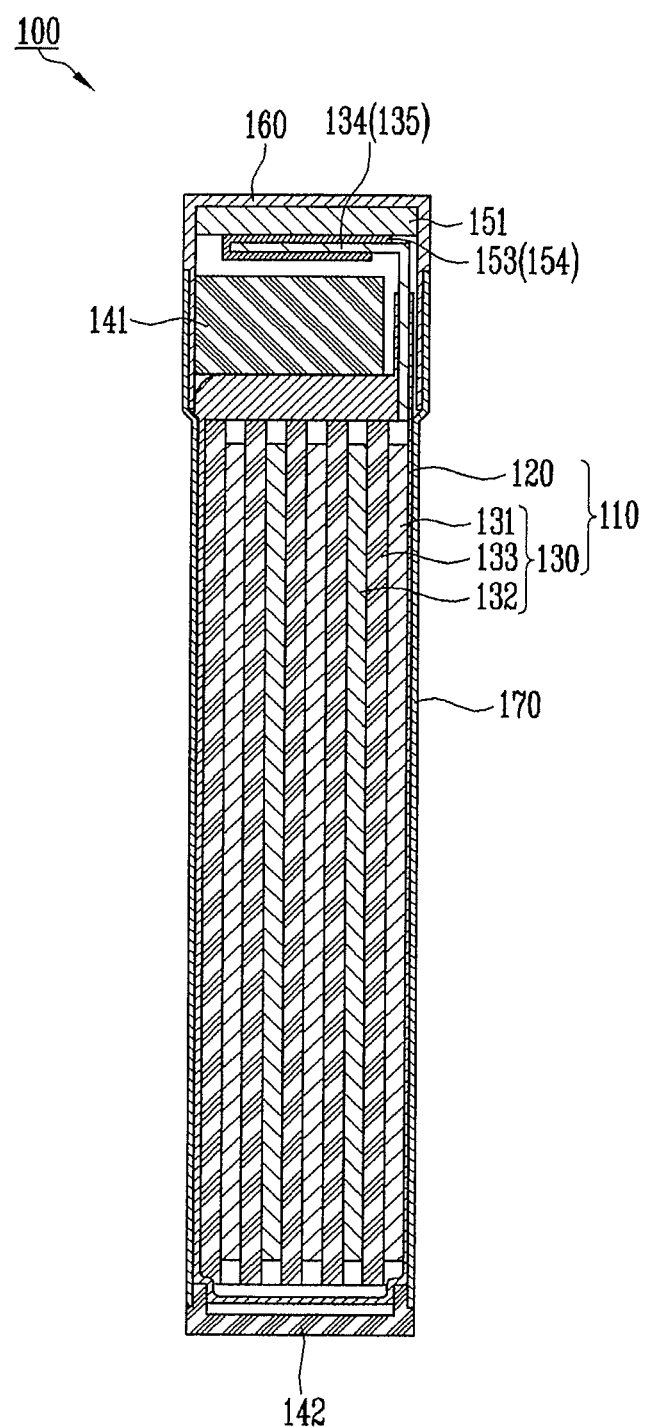
FIG. 12 is a sectional view of the battery pack of FIG. 10.

FIG. 10 is a perspective view of a battery pack according to an embodiment of the present invention. FIG. 11 is an exploded view of the battery pack of FIG. 10. FIG. 12 is a sectional view of the battery pack of FIG. 10.

Referring to FIGS. 10 to 12, the battery pack 100 includes a bare cell 110, a holder frame 140 for surrounding the bare cell 110, a protection circuit module 150 electrically connected to the bare cell 110 and fixed to the holder frame 140, and a cover 160 fixed to the holder frame 140 while surrounding the protection circuit module 150. The battery pack 100 may further include an outer label 170 for surrounding the bare cell 110 and the holder frame 140. A water sensitive paper 180 may be provided on the cover 160.

The bare cell 110 includes a pouch type outer case 120, an electrode assembly 130 accommodated in the inside of the outer case 120, and an electrolyte.

The outer case 120 is provided with first and second surfaces 121 and 122 having two broad areas corresponding to each other, and four surfaces, i.e., third to sixth surfaces 123, 124, 125 and 126 having relatively narrow areas to connect the first and second surfaces 121 and 122. The third surface 123 among the four surfaces corresponds to a front surface through which two electrode tabs 134 and 135 are extracted.

The electrode assembly 130 is formed by sequentially stacking or winding a positive electrode plate 131, a negative electrode plate 132 and a separator 133. One end of each of the two electrode tabs 134 and 135 is attached to the positive and negative electrode plates 131 and 132, respectively, and the other end of each of the two electrode tabs 134 and 135 extends to the exterior of the electrode assembly 130 through the third surface 123 of the outer case 120. A solid electrolyte or gel electrolyte may be used as the electrolyte.

The positive electrode plate 131 includes a sheet-shaped positive electrode collector and a positive electrode active material coated on the positive electrode collector. The negative electrode plate 132 includes a sheet-shaped negative electrode collector and a negative electrode active material coated on the negative electrode collector.

The positive electrode active material may include a transition metal oxide containing lithium and a lithium chalcogenide compound. Here, the transition metal oxide containing lithium is representative as a metal oxide such as $LiCoO_2$, $LiNiO_2$, $LiMnO_2$, $LiMn_2O_4$ or $LiNi_{1-x-y}Co_xM_yO_2$ (here, $0 \leq x \leq 1$, $0 \leq y \leq 1$, $0 \leq x+y \leq 1$ and M is a metal such as Al, Sr, Mg or La). The negative electrode active material may be a carbon material such as a crystalline carbon, an amorphous carbon, a carbon composite or a carbon fiber, a lithium metal or a lithium alloy.

The positive and negative electrode collectors may be formed of one selected from the group consisting of stainless steel, nickel, copper, aluminum and an alloy thereof. In order to maximize efficiency, the positive electrode collector may be formed of aluminum or aluminum alloy, and the negative electrode collector may be formed of copper or copper alloy.

The separator 133 is positioned between the positive and negative electrode plates 131 and 132. The separator 133 is provided to prevent an electrical short circuit between the positive and negative electrode plates 131 and 132 and to allow lithium ions to be moved. The separator 133 may be formed of a polyolefin-based polymer film such as a polyethylene (PE) or polypropylene (PP) or a multiple film thereof.

The holder frame 140 is a rectangular frame structure with a size surrounding the outline of the bare cell 110. For example, the holder frame 140 includes a pair of first and second sub-frames 141 and 142 opposite to each other and a pair of third and fourth sub-frames 143 and 144 opposite to each other, which form a roughly rectangular frame shape. The interval H between the first and second sub-frames 141 and 142 substantially corresponds to the height of the bare cell 110, and the interval W between the third and fourth sub-frames 143 and 144 substantially corresponds to the width of the bare cell 110.

The holder frame 140 may be formed of a material such as polyamide, polyurethane or plastic. Fiber reinforced plastic or engineering plastic may be used as the plastic. The holder frame 140 may be formed by injection molding a hot-melt resin or an equivalent thereof.

The protection circuit module 150 is provided on an exterior of the holder frame 140. The protection circuit module 150 is fixed between the cover 160 and the holder frame 140 so as to be electrically connected to the bare cell 110. The protection circuit module 150 includes a mounting substrate 151, at least one electronic component 152 formed on one surface of the mounting substrate 151, connecting members 153 and 154 formed on the same surface as the surface having the electronic component 152 formed thereon and electrically connected to the bare cell 110, and an external terminal 155 formed on the opposite surface to the surface having the connecting members 153 and 154 formed thereon.

The external terminal 155 is electrically connected to the connecting members 153 and 154 through a conductive pattern in the mounting substrate 151. The external terminal 155 is exposed to the exterior through the cover 160 so as to conduct current of the bare cell 110 to the exterior therethrough.

The cover 160 includes a box-shaped body 161 having an internal space and an opened surface. The cover 160 is provided with a plurality of external terminal holes 161a. The external terminal holes 161a allow the external terminal 155 of the protection circuit module 150 to be exposed to the exterior therethrough. The cover 160 may be formed of a material such as polyamide, polyurethane or plastic.

The outer label 170 is formed to surround the first and second surfaces 121 and 122 and the third and fourth sub-frames 143 and 144 of the holder frame 140. An adhesive or gluing agent may be provided on one surface of the outer label 170 that contacts the bare cell 110 and the holder frame 140. The outer label 170 may be formed of any one of polyethylene terephthalate (PET) and an equivalent thereof.

Figure 13:
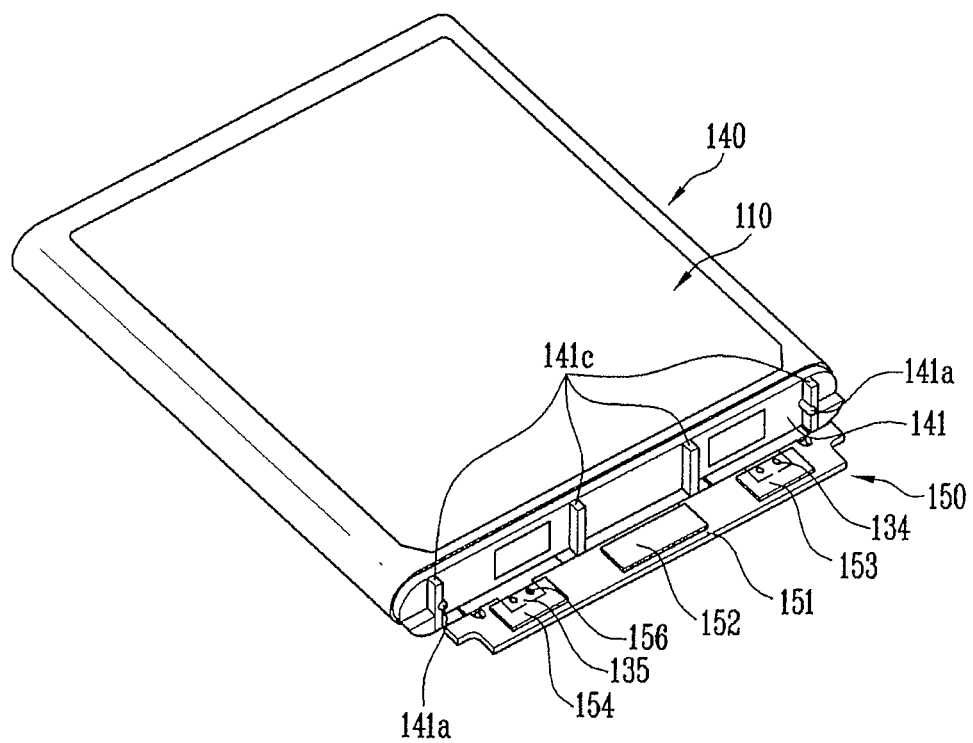
FIG. 13 is a perspective view illustrating a main manufacturing process of the battery pack of FIG. 10.

The manufacturing method of the battery pack 100 according to this embodiment will be described in more detail. FIG. 13 is a perspective view illustrating a main manufacturing process of the battery pack of FIG. 10.

First, the bare cell 110, which is completely manufactured, is examined, and the electrode tabs 134 and 135 extending to the exterior of the bare cell 110 are cut to have a predetermined length. Then, the bare cell 110 is inserted into the holder frame 140. Subsequently, the electrode tabs 134 and 135 protruding to the exterior of the holder frame 140 from the bare cell 110 are inserted between first and second layers of the connecting member 153 and 154 of the protection circuit module 150, respectively.

As illustrated in FIG. 13, the movement of the electrode tabs 134 and 135 inserted between the first and second layers of the connecting members 153 and 154 is limited by spacers formed between the first and second layers, respectively. Thus, the electrode tabs 134 and 135 are easily welded to the connecting members 153 and 154, respectively. The welding may be performed using a point welding method. When the welding is performed using the point welding method, welding points may be formed on an outer surface of each of the connecting members 153 and 154.

Subsequently, the protection circuit module 150 is folded in a vertical direction toward the holder frame 140. At this time, the electrode tabs 134 and 135 are bent approximately vertically, and the protection circuit module 150 is in parallel with the first sub-frame 141. Fixing projections 141a of the first sub-frame 141 are positioned to correspond to cut-away portions 151a so that the protection circuit module 150 is fixed to the first sub-frame 141. The mounting substrate 151 of the protection circuit module 150 is spaced from the first sub-frame 141 at a predetermined space by bump portions 141c. The space formed by the bump portions 141c becomes an accommodation space of the connecting members 153 and 154 and the electronic component 152.

Subsequently, the cover 160 is coupled to the holder frame 140. When the cover 160 is coupled to the holder frame 140, the external terminal 155 of the protection circuit module 150 is exposed to the exterior through the external terminal holes 161. The outer label 170 is attached to the outer circumferential surface of the bare cell 110.

Finally, the water sensitive paper 180 is attached to the cover 160, and a function test of a secondary battery is performed, thereby completely manufacturing the battery pack 100.

Figure 14:
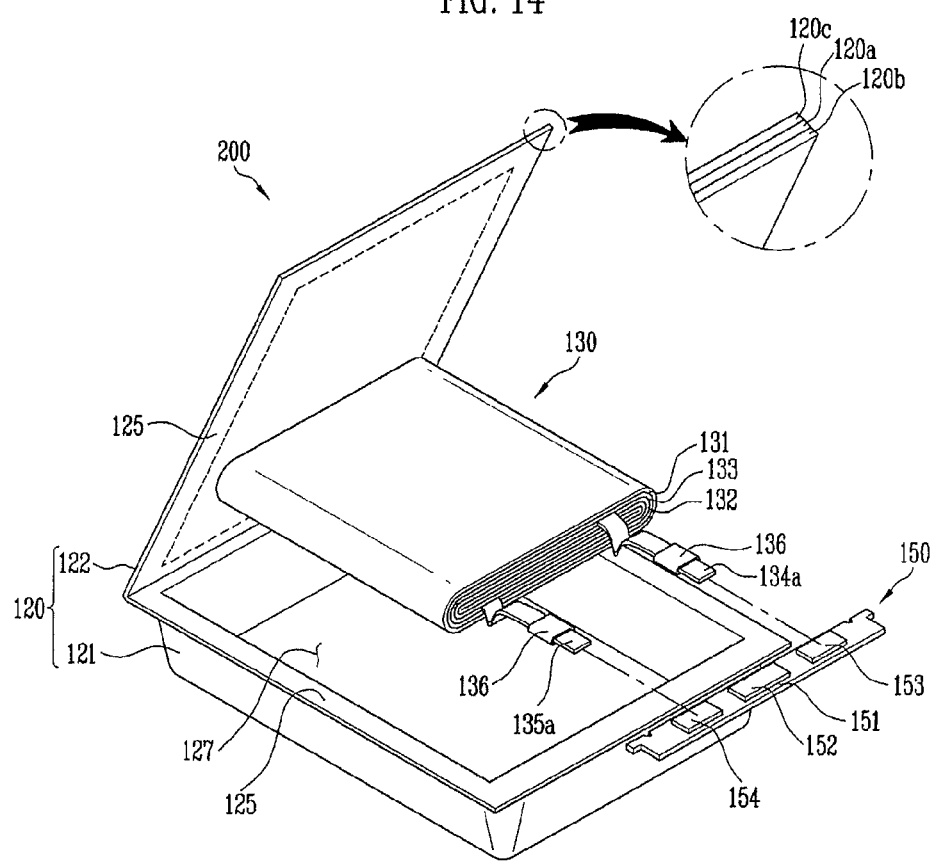
FIG. 14 is an exploded view of a battery pack according to another embodiment of the present invention.

FIG. 14 is an exploded view of a battery pack according to another embodiment of the present invention.

Referring to FIG. 14, the battery pack 200 according to this embodiment includes a bare cell and a protection circuit module 150 connected to the bare cell.

The bare cell is provided with an electrode assembly 130 and a pouch type outer case 120 for accommodating the electrode assembly 130 therein. The bare cell is individually connected to positive and negative electrode plates 131 and 132 of the electrode assembly 130. The bare cell is provided with first and second electrode tabs 134a and 135a of which portions protrude to the exterior of the outer case 120. The first electrode tab 134a may be a positive electrode tab connected to the positive electrode plate 131, and the second electrode tab 135a may be a negative electrode tab connected to the negative electrode plate 132. The two electrode tabs 134a and 135a are connected to two connecting members 153 and 154 of the protection circuit module 150.

The outer case 120 includes a first outer case 121 having an accommodating portion 127 into which the electrode assembly 130 is inserted, and a second outer case 122 for covering a top opening of the accommodating portion 127 in the first outer case 121. The accommodating portion 127 may be formed using a method such as press working.

The outer case 120 is provided with first and second sealing portions 125 respectively positioned at edges of the first and second outer cases 121 and 122 and bonded to each other. Insulative tab tapes 136 may be provided between the first and second sealing portions 125 and the electrode tabs 134a and 135a extracted from the interior to the exterior of the outer case 120.

The first and second outer cases 121 and 122 have a structure in which first and second insulating layers 120b and 120c are stacked with a metal layer 120a interposed therebetween. The first insulating layer 120b is formed on the contact surface of the first and second outer cases 121 and 122. The metal layer 120a may be formed of any one selected from the group consisting of aluminum, steel, stainless steel and an alloy thereof. The first insulating layer 120b may be formed of any one selected from the group consisting of casted polypropylene (CPP), polypropylene (PP) and an equivalent thereof. The first insulating layer 120b may be formed of any material that can serve as a sealant having a thermal fusion bonding property. The second insulating layer 120c may be formed of any one selected from the group consisting of polyethylene terephthalate (PET), nylon and an equivalent thereof. The second insulating layer 120c of this embodiment is not limited to the aforementioned material.

The protection circuit module 150 is substantially identical to the protection circuit module described with reference to FIG. 8 or 11.

In the connection of the two electrode tabs 134a and 135a to the connecting members 153 and 154 of the protection circuit module 150, the two electrode tabs 134a and 135a are inserted between two layers of the two connecting members 153 and 154, respectively, and then bonded to the connecting members 153 and 154 through a bonding method such as point welding.

According to this embodiment, the protection circuit module 150 may be located at one side of the bare cell without using a separate frame. Since the welding is performed in the state that the electrode tabs 134a and 135a are respectively inserted into the connecting members 153 and 154, a welding process can be very easily performed. Accordingly, in a welding process that requires a lot of carefulness for a small area, welding failures can be decreased, and time for the welding process can be reduced.

According to the aforementioned embodiments, an electrode tab of a bare cell is fixedly inserted into a connecting member with a non-bent structure, so that the movement of the electrode tab can be limited in a bonding process, and therefore, the bonding process can be easily and stably performed. Further, the movement of the electrode tab is limited, thereby reducing failures in the bonding process. That is, the productivity and yield of battery packs can be improved, and manufacturing cost can be saved. As noted above, while an electrode tab is used as an example herein, the connecting member is adapted to receive any tab of the secondary battery.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A battery pack comprising:
a bare cell comprising an electrode assembly;
a tab electrically connected to the bare cell;
and a protection circuit module electrically coupled to the bare cell, the protection circuit module comprising:
a substrate; and
a connecting member on the substrate electrically coupled to the tab, the connecting member comprising:
a planar first layer;
a planar second layer facing and entirely spaced from the first layer;
a connecting portion at a periphery of and between the first layer and the second layer and spacing the first layer from the second layer; and
a spacer contacting both the first layer and the second layer and coupled to at least one of the first layer and the second layer, wherein the spacer is threaded into a groove in the second layer and wherein the tab is between the planar first layer and the planar second layer.

2. The battery pack according to claim 1, wherein the connecting member is coupled to the substrate.

3. The battery pack according to claim 1, wherein the spacer is coupled to both of the first and second layers.

4. The battery pack according to claim 1, wherein an area of the first layer is less than an area of the second layer and wherein the spacer extends from an edge of the first layer toward the second layer.

5. The battery pack of claim 1, further comprising a holder frame housing the bare cell.

6. The battery pack of claim 1, wherein the tab comprises an electrode tab of the bare cell or a PTC tab electrically connected to an electrode terminal of the battery pack.

7. The battery pack of claim 1, wherein the tab is welded to any one of the first or second layers.

* * * * *